(12) United States Patent
Yao et al.

(10) Patent No.: US 9,275,960 B2
(45) Date of Patent: Mar. 1, 2016

(54) INTEGRATED CIRCUIT FORMED USING SPACER-LIKE COPPER DEPOSITION

(71) Applicant: Taiwan Semiconductor Manufacturing Company, Ltd., Hsin-Chu (TW)

(72) Inventors: Hsin-Chieh Yao, Yunlin County (TW); Cheng-Hsiung Tsai, Chunan Town (TW); Chung-Ju Lee, Hsinchu (TW); Hsiang-Huan Lee, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 416 days.

(21) Appl. No.: 13/628,346

(22) Filed: Sep. 27, 2012

(65) Prior Publication Data

US 2014/0084479 A1 Mar. 27, 2014

(51) Int. Cl.
| | |
|---|---|
| *H01L 23/00* | (2006.01) |
| *H01L 21/02* | (2006.01) |
| *H01L 23/522* | (2006.01) |
| *H01L 23/528* | (2006.01) |
| *H01L 23/532* | (2006.01) |
| *H01L 21/768* | (2006.01) |

(52) U.S. Cl.
CPC ........ *H01L 23/562* (2013.01); *H01L 21/02263* (2013.01); *H01L 23/5222* (2013.01); *H01L 23/5283* (2013.01); *H01L 23/5329* (2013.01); *H01L 23/53295* (2013.01); *H01L 21/76837* (2013.01); *H01L 21/76879* (2013.01); *H01L 21/76885* (2013.01); *H01L 2924/0002* (2013.01)

(58) Field of Classification Search
CPC ........ H01L 21/44; H01L 21/31; H01L 21/311
USPC ........................................................ 257/774
See application file for complete search history.

(56) References Cited

U.S. PATENT DOCUMENTS

| | | | |
|---|---|---|---|
| 2003/0124838 A1* | 7/2003 | Huang | 438/633 |
| 2010/0120246 A1* | 5/2010 | Schrinsky | 438/669 |
| 2010/0170868 A1* | 7/2010 | Lin et al. | 216/13 |

* cited by examiner

*Primary Examiner* — William Harriston
(74) *Attorney, Agent, or Firm* — Slater & Matsil, L.L.P.

(57) ABSTRACT

A method of forming a semiconductor device includes depositing a metal spacer over a core supported by a first extremely low-k dielectric layer having metal contacts embedded therein, etching away an upper portion of the metal spacer to expose the core between remaining lower portions of the metal spacer, removing the core from between the remaining lower portions of the metal spacer, and depositing a second extremely low-k dielectric layer over the remaining lower portions of the metal spacer.

20 Claims, 6 Drawing Sheets

INTEGRATED CIRCUIT FORMED USING SPACER-LIKE COPPER DEPOSITION

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits.

One of the goals of the semiconductor industry is to continue shrinking the size and increasing the speed of individual devices. However, isolating devices with 28 nm transistor nodes, 20 nm transistor nodes, and nodes beyond has presented challenges. For example, metal gap filling becomes increasingly difficult as the node size decreases.

In addition, the processes used to form sub 28 nm transistor nodes may undesirably damage, for example, a low-k dielectric material incorporated in the device. Furthermore, the processes may also negatively impact wafer acceptance test (WAT) yield and reliability results.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a semiconductor device. The concepts in the disclosure may also apply, however, to integrated circuits or other semiconductor structures.

Figure 1A:
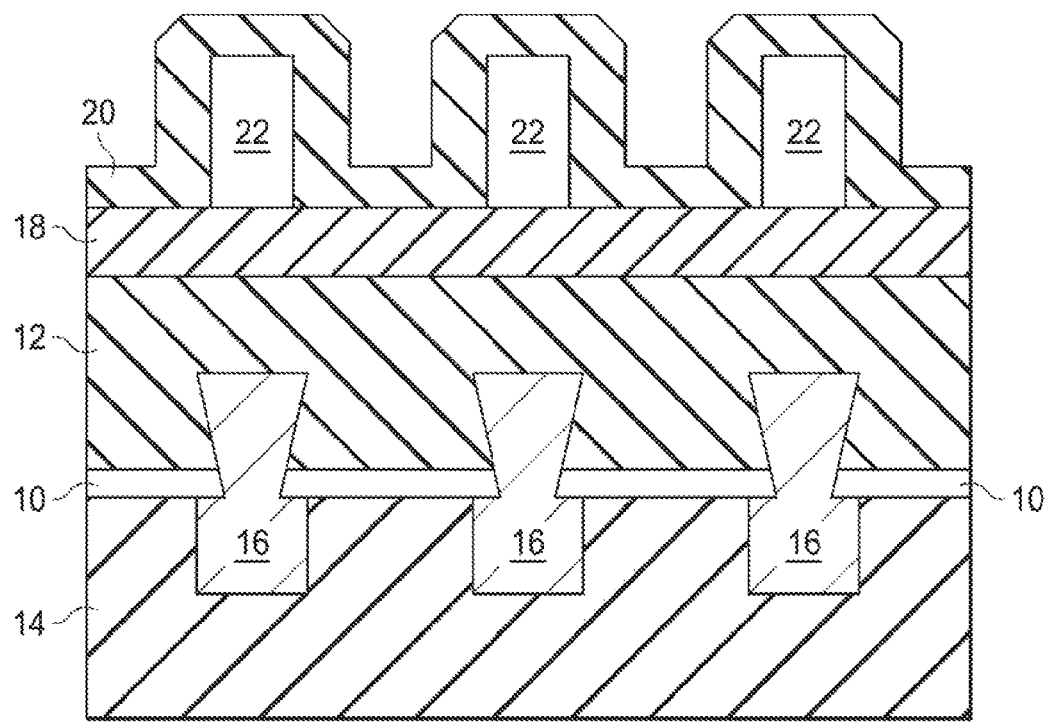
FIGS. 1A-1F collectively illustrate a conventional method of forming a semiconductor device.

Referring collectively to FIGS. 1A-1F, a conventional method of forming metallization in a semiconductor device is illustrated. As shown in FIG. 1A, an etch stop layer (ESL) 10 is disposed between a first extremely low-k dielectric layer 12 and a second extremely low-k dielectric layer 14. In general, low-k dielectrics have a dielectric constant less than that of $SiO_2$, which is about 4. Low-k dielectrics may also include a class of dielectrics referred to as extremely low-k (ELK) dielectrics, which have a dielectric constant less than about 2.5. The extremely low-k dielectrics may be used as interlayer dielectrics (ILDs) for sub-micron technology (e.g., for 65 nm node, 45 nm node, or beyond technology). In addition, the extremely low-k dielectrics may be porous.

Still referring to FIG. 1A, the first and second extremely low-k dielectric layers 12, 14 include, for example, metal contacts 16 embedded or formed therein. As used herein, the metal contacts 16 may also refer to other forms of metallization such as, for example, a top metal (M0), a metal one (M1), and so on. A sacrificial hard mask 18 is disposed upon the first low-k dielectric layer 12. As will be more fully explained below, in the conventional method the sacrificial hard mask 18 is needed for transferring patterns to the first low-k dielectric layer 12. As shown in FIG. 1A, a spacer layer 20 is generally deposited on or formed over a core 22. The core 22 may be formed from, for example, ash.

Figure 1B:
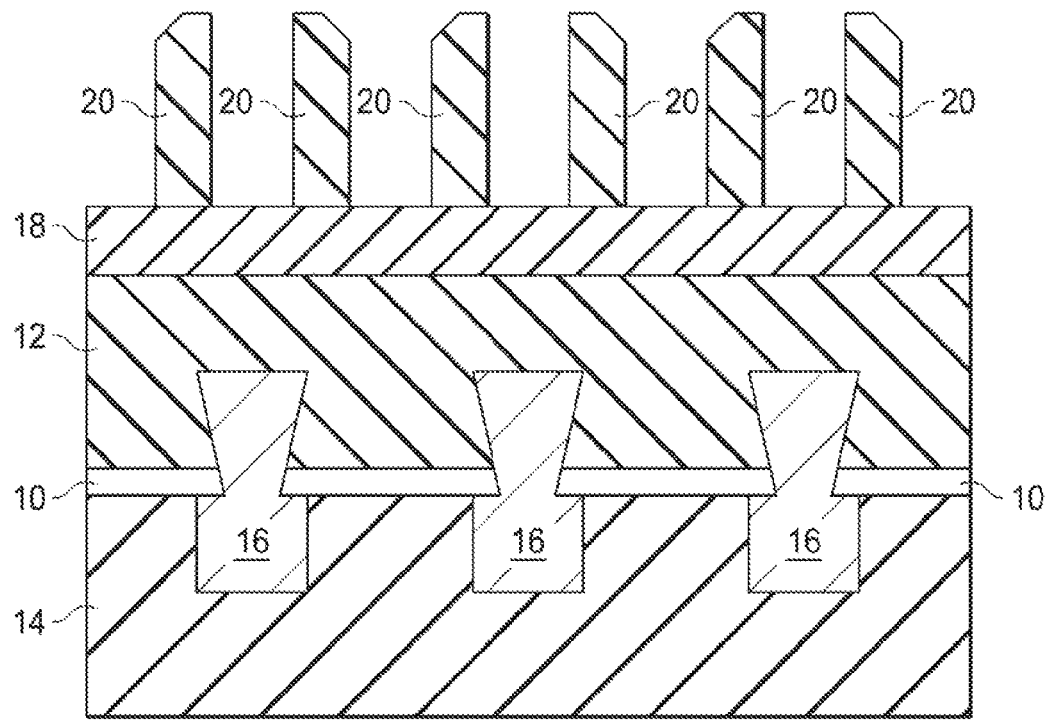
Figure 1C:
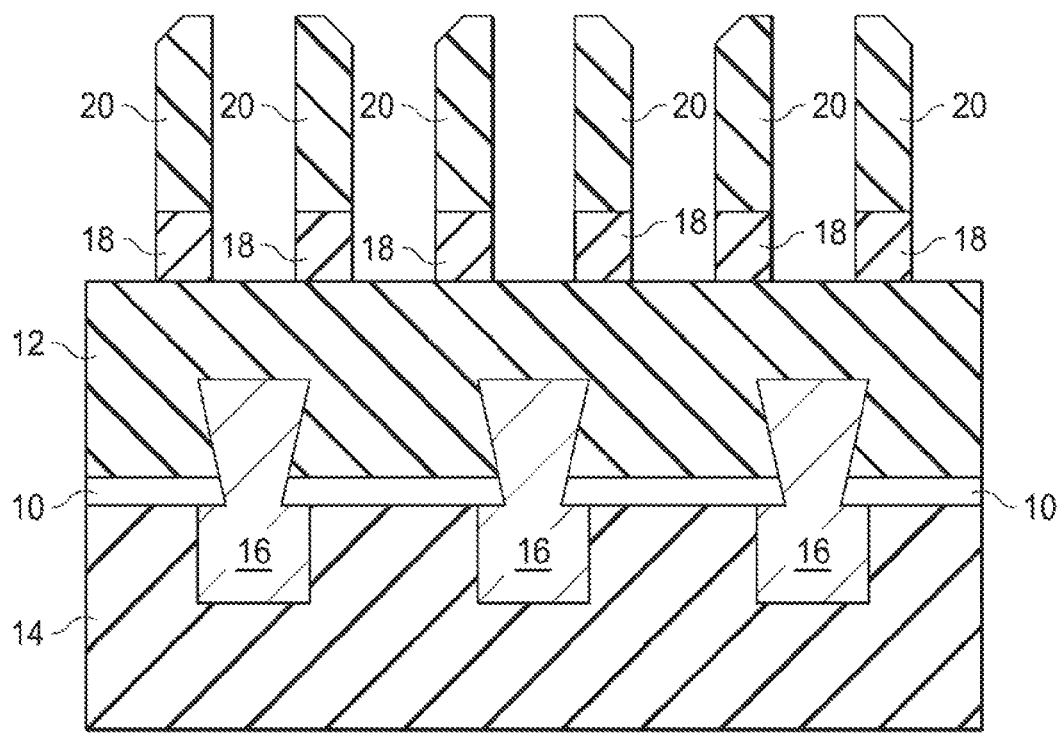
Figure 1D:
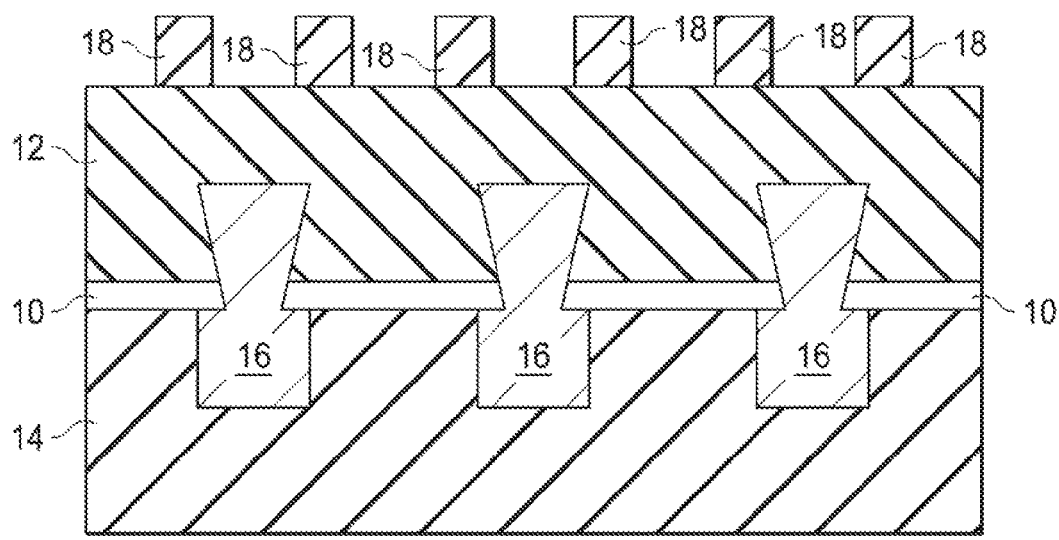
Figure 1E:
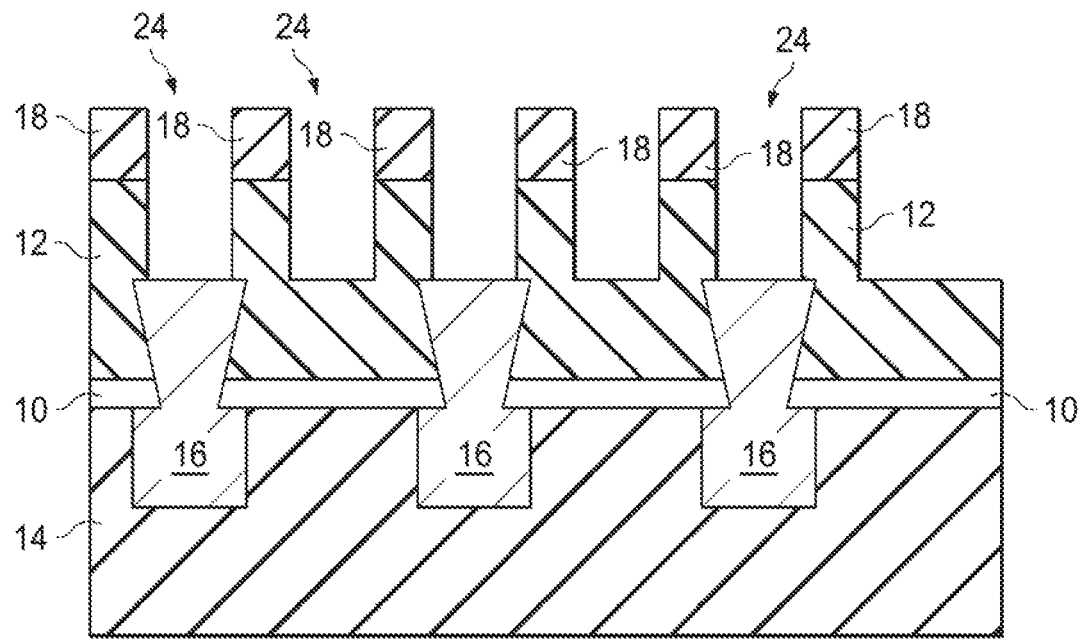

Referring to FIGS. 1A-1B, the spacer layer 20 and the core 22 are etched such that the core 22 is eliminated and only lower, spaced-apart portions of the spacer layer 20 remain. Thereafter, as shown in FIG. 1C, the hard mask 18 is opened where not covered by the remaining lower portions of the spacer layer 20. After the hard mask 18 has been opened, the remaining lower portions of the spacer layer 20 are removed as shown in FIG. 1D. Thereafter, as shown in FIG. 1E, the first extremely low-k dielectric layer 12 is etched. As shown in FIG. 1E, the first extremely low-k layer 12 is opened where not covered by the remaining hard mask 18. Unfortunately, when the first extremely low-k dielectric layer 12 is etched in this manner the k-value of the layer is detrimentally affected. In other words, the k-value of the first extremely low-k dielectric layer 12 is undesirably damaged.

Figure 1F:
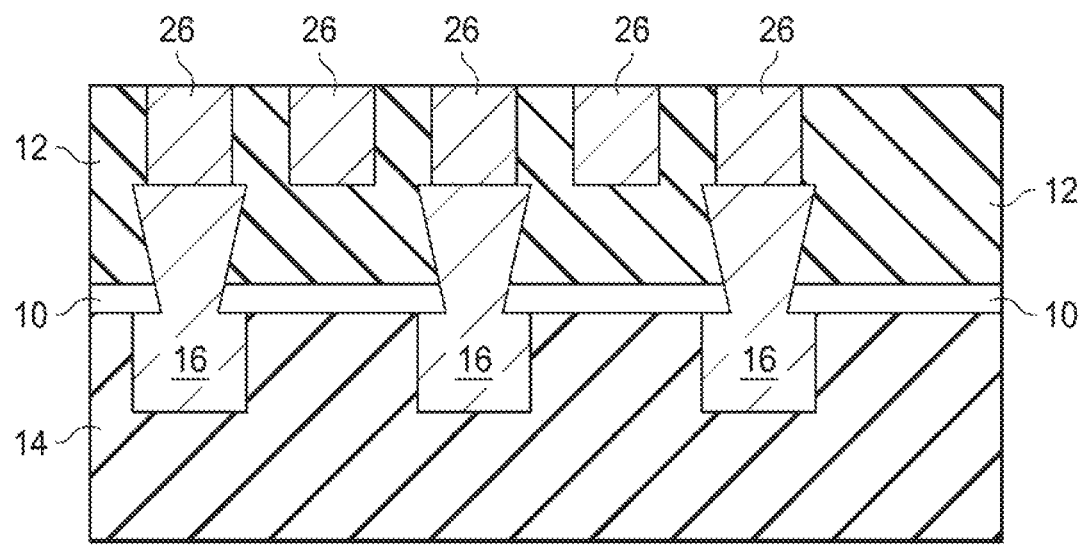

Next, as shown in FIGS. 1E-1F, the areas or gaps 24 opened up when the first extremely low-k layer 12 was etched are filled with a metal 26 such as, for example, copper. Unfortunately, there is a small window available for filling the gap 24 with metal 26. In other words, there is a metal gap filling limitation. This is due to the small size of the gap 24. As devices continue to shrink into the N28, N20, and beyond transistor node sizes, the limited size of the gap 24 becomes extremely problematic when trying to fill the gap 24 with metal. If the gap 24 is not suitably filled, the device may not operate properly or may have reliably issues.

Figure 2A:
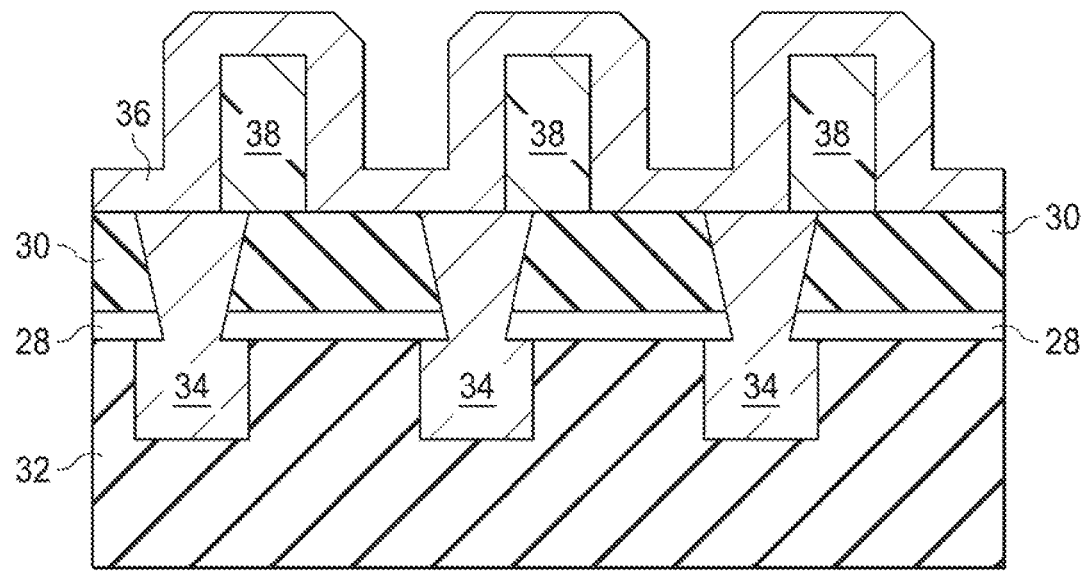
FIGS. 2A-2F collectively illustrate an embodiment method of forming a semiconductor device.

Referring collectively to FIGS. 2A-2F, an embodiment method of forming metallization in a semiconductor device is illustrated. As shown in FIG. 2A, an etch stop layer (ESL) 28 is disposed between a first extremely low-k dielectric layer 30 and an underlying supporting extremely low-k dielectric layer 32. The first and supporting extremely low-k dielectric layers 30, 32 include, for example, metal contacts 34 embedded or formed therein. As used herein, the metal contacts 34 may also refer to other forms of metallization such as, for example, a top metal (M0), a metal one (M1), and so on. Unlike the process illustrated in FIGS. 1A-1F, there is no sacrificial hard mask used in the embodiment process of FIGS. 2A-2F.

Still referring to FIG. 2A, a metal spacer 36 has been deposited over a core 38. As shown, each of the metal spacer 36 and core 38 are generally supported by the underlying first extremely low-k dielectric layer 30. In an embodiment, the metal spacer 36 is formed from copper or another conductive material. In an embodiment, the core 38 is formed from a photo resist and the metal spacer 36 is deposited over the core 38 using a physical vapor deposition (PVD) process at about room temperature or a chemical vapor deposition (CVD) process in a range of about room temperature to about 400° C.

In an embodiment, the core 38 is formed from a dielectric hard mask and the metal spacer 36 is deposited over the core 38 using a physical vapor deposition (PVD) process or a chemical vapor deposition (CVD) process. In an embodiment, the core 38 is formed from a metal hard mask and the metal spacer 36 is deposited over the core 38 using a physical vapor deposition (PVD) process or a chemical vapor deposition (CVD) process.

Figure 2B:
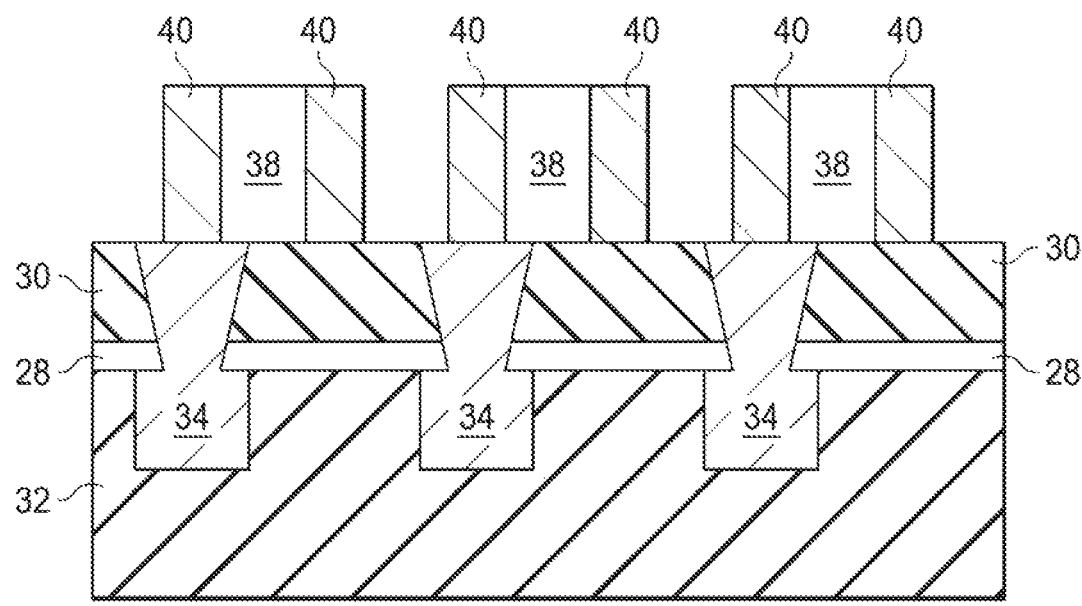
Figure 2C:
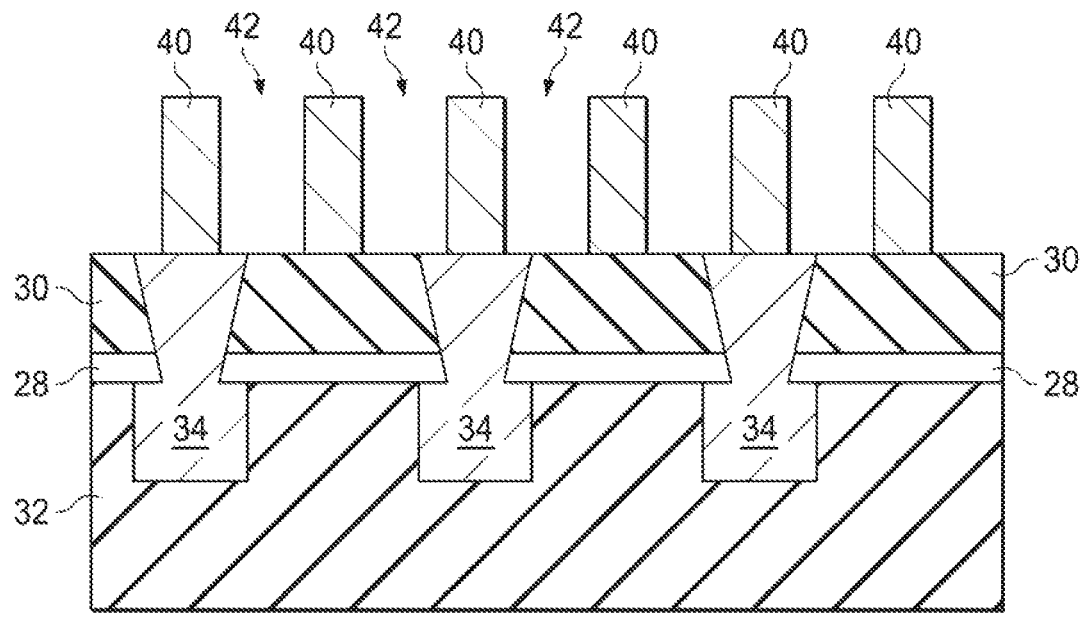

Referring now to FIG. 2B, an upper portion of the metal spacer 36 is etched away to expose the core 38 between remaining lower portions 40 of the metal spacer 36. In an embodiment, a portion of the core 38 may also be etched away during this step. Next, as shown in FIG. 2C, the core 38 (or remaining core) is removed from in between the remaining lower portions 40 of the metal spacers 36. As shown, the remaining lower portions 40 of the metal spacer 36 generally form spaced-apart, vertically-oriented portions of metal having a gap 42 or space therebetween.

Figure 2D:
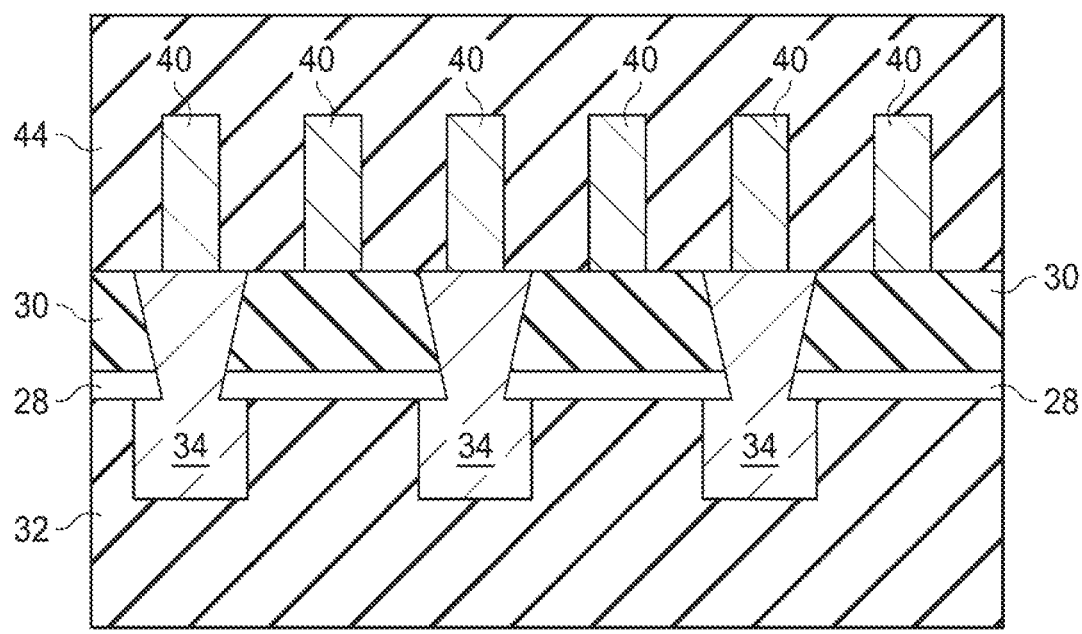

Moving to FIG. 2D, a second extremely low-k dielectric layer 44 is deposited over the remaining lower portions 40 of the metal spacer 36. In other words, the remaining lower portions 40 of the spacer 36 are covered with the second extremely low-k dielectric layer 44. In an embodiment, the second extremely low-k dielectric layer 44 between the remaining lower portions of the spacer 36 are oriented in a dielectric pattern, which is established without having to use a sacrificial hard mask. Rather, the dielectric pattern is defined by the remaining lower portions of the spacer 36 as shown in FIG. 2D. As shown in FIG. 2D, the remaining lower portions 40 of the metal spacer 36 are electrically coupled with the metal contacts 34 (or other metallization) embedded in the first extremely low-k dielectric layer 30.

Figure 2E:
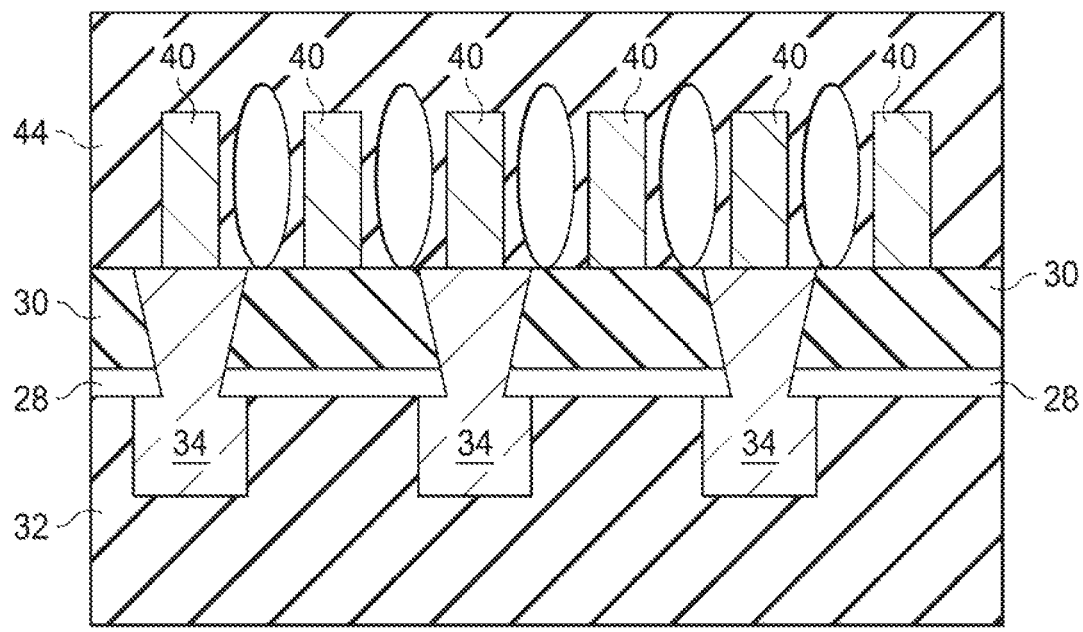

Referring now to FIG. 2E, in an embodiment an air gap 46 (i.e., an air pocket) is formed between the remaining lower portions 40 of the metal spacer 36. The air gap 46 is optional and may be added to the device in order to further lower the k-value. In an embodiment, the air gap 46 only partially fills the space between the remaining lower portions 40 of the metal spacer 36. In other words, some of the space is also filled with portions of the second extremely low-k dielectric layer 44.

Figure 2F:
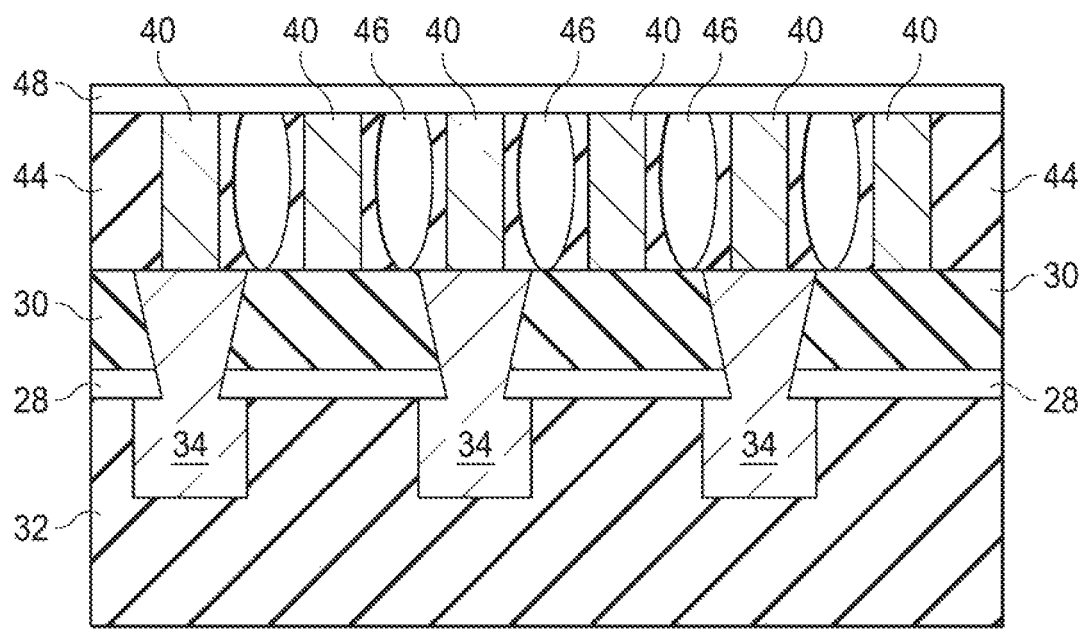

Referring now to FIG. 2F, in an embodiment a chemical-mechanical planarization (CMP) process is performed to remove some of the second extremely low-k dielectric layer 44. The chemical-mechanical planarization process is optional and may only be called for if the vertical metal etching fails to achieve a suitable profile. The chemical-mechanical planarization process may give the remaining lower portions 40 of the metal spacer 36 a more uniform profile. After the chemical-mechanical planarization process has been performed, an etch stop layer 48 may be formed over the second extremely low-k dielectric layer 44 and the remaining lower portions 40 of the metal spacer 36.

It should be recognized that the embodiment methods of forming a semiconductor device disclosed herein offer numerous benefits and advantages. For example, the metal gap limitation in N28, N20, and beyond transistor nodes is overcome. Indeed, the gap is no longer filled with metal. Rather, the metal trench is directly defined.

In addition, by refilling the gap with extremely low-k dielectric material, damage to the dielectric layer is prevented or eliminated. As such, the k-value is not adversely affected by the damage. Further, use of the embodiment method beneficially lowers the resistance and capacitance (RXC) window of the semiconductor device. Moreover, use of the embodiment methods prevents or eliminates pits or voids in the metal contacts, which can negatively impact wafer acceptance test (WAT) yields and reliability results.

Still further, the embodiment methods provide a cost saving because of a simpler film scheme. Also, the vertical height (a.k.a., the thickness) of remaining lower portions 40 of the metal spacer 36 may be easily controlled by controlling the initial deposition of the metal spacer 36 and/or the etching process to remove the upper portion thereof.

An embodiment method of forming a semiconductor device includes depositing a metal spacer over a core supported by a first extremely low-k dielectric layer having metal contacts embedded therein, etching away an upper portion of the metal spacer to expose the core between remaining lower portions of the metal spacer, removing the core from between the remaining lower portions of the metal spacer, and depositing a second extremely low-k dielectric layer over the remaining lower portions of the metal spacer.

An embodiment method of forming a semiconductor device includes depositing a copper spacer over a core formed on a first extremely low-k dielectric layer having metal contacts embedded therein, etching away an upper portion of the copper spacer to expose the core between remaining lower portions of the copper spacer, removing the core from between the remaining lower portions of the copper spacer, and covering the remaining lower portions of the copper spacer with a second extremely low-k dielectric layer, the second extremely low-k dielectric layer between the remaining lower portions of the copper spacer oriented in a dielectric pattern established without having to use a sacrificial hard mask.

An embodiment semiconductor device includes a first extremely low-k dielectric layer having metal contacts embedded therein, remaining portions of a metal spacer disposed upon the first extremely low-k dielectric layer and the metal contacts, a second extremely low-k dielectric layer adjacent to at least one of the remaining portions of the metal spacer, and an air gap disposed between at least one pair of the remaining portions of the metal spacer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a semiconductor device, comprising:
    depositing a metal spacer over a core supported by a first extremely low-k dielectric layer having metal contacts embedded therein, wherein the core comprises raised features above an underlying substrate;
    removing an upper portion of the metal spacer to expose the core between remaining lower portions of the metal spacer;
    removing the core from between the remaining lower portions of the metal spacer; and
    depositing a second extremely low-k dielectric layer over the remaining lower portions of the metal spacer; and
    performing a chemical-mechanical planarization (CMP) process to remove some of the second extremely low-k dielectric layer.

2. The method of claim 1, wherein the metal spacer is formed from copper.

3. The method of claim 1, further comprising forming the core from a photo resist.

4. The method of claim 3, further comprising depositing the metal spacer over the core using a physical vapor deposition (PVD) process at about room temperature.

5. The method of claim 3, further comprising depositing the metal spacer over the core using a chemical vapor deposition (CVD) process in a range of about room temperature to about 400° C.

6. The method of claim 1, further comprising forming the core from a dielectric hard mask.

7. The method of claim 6, further comprising depositing the metal spacer over the core using at least one of a physical vapor deposition (PVD) process and a chemical vapor deposition (CVD) process.

8. The method of claim 1, wherein the core is formed from a metal hard mask.

9. The method of claim 8, further comprising depositing the metal spacer over the core using at least one of a physical vapor deposition (PVD) process and a chemical vapor deposition (CVD) process.

10. The method of claim 1, further comprising forming an air gap between the remaining lower portions of the metal spacer.

11. The method of claim 1, further comprising electrically coupling the remaining lower portions of the metal spacer with the metal contacts embedded in the first extremely low-k dielectric layer.

12. The method of claim 1, further comprising forming an etch stop layer over the second extremely low-k dielectric layer and the remaining lower portions of the metal spacer remaining after the chemical-mechanical planarization (CMP) process.

13. A method of forming a semiconductor device, comprising:
    depositing a metal spacer over a core formed on a first extremely low-k dielectric layer having metal contacts embedded therein, wherein the core comprises a patterned layer, the patterned layer having raised features, an upper surface of the metal spacer between adjacent raised features being lower than an upper surface of the adjacent raised features;
    removing an upper portion of the metal spacer to expose the core between remaining lower portions of the metal spacer, wherein at least a portion of the first extremely low-k dielectric layer between the remaining lower portions of the metal spacer is exposed after removing the upper portion of the metal spacer while the core covers at least a portion of the first extremely low-k dielectric layer;
    removing the core from between the remaining lower portions of the metal spacer; and
    covering the remaining lower portions of the metal spacer with a second extremely low-k dielectric layer, the second extremely low-k dielectric layer between the remaining lower portions of the metal spacer.

14. The method of claim 13, wherein the core is formed from one of a photo resist, a dielectric hard mask, and a metal hard mask and the metal spacer is deposited over the core using at least one of a physical vapor deposition (PVD) process and a chemical vapor deposition (CVD) process.

15. The method of claim 14, further comprising forming an air gap between the remaining lower portions of the metal spacer.

16. The method of claim 15, performing a chemical-mechanical planarization (CMP) process to remove some of the second extremely low-k dielectric layer.

17. The method of claim 16, further comprising forming an etch stop layer over the second extremely low-k dielectric layer and the remaining lower portions of the metal spacer remaining after the chemical-mechanical planarization (CMP) process.

18. A method of forming a semiconductor device, comprising:
    providing a first dielectric layer having conductive features therein, an upper surface of the first dielectric layer and an upper surface of the conductive features forming a first surface;
    forming raised features over the first surface;
    forming a conductive layer over the raised features and the first surface;
    removing portions of the conductive layer such that portions of the conductive layer along sidewalls of the raised features remain, thereby forming conductive elements, the removing portions of the conductive layer exposing at least a portion of the first dielectric layer between adjacent raised features;
    removing the raised features; and
    forming a second dielectric layer between the conductive elements.

19. The method of claim 18, wherein the forming the second dielectric layer results in a void between adjacent conductive elements.

20. The method of claim 13, wherein the metal spacer is a copper spacer.

* * * * *